(12) United States Patent
Suzuki et al.

(10) Patent No.: US 7,289,001 B2
(45) Date of Patent: Oct. 30, 2007

(54) DIELECTRIC SUBSTRATE FOR OSCILLATOR

(75) Inventors: Kenji Suzuki, Nagoya (JP); Tatsuya Tsuruoka, Ena (JP)

(73) Assignee: NGK Insulators, Ltd., Nagoya (JP)

( * ) Notice: Subject to any disclaimer, the term of this patent is extended or adjusted under 35 U.S.C. 154(b) by 17 days.

(21) Appl. No.: 11/293,008

(22) Filed: Dec. 2, 2005

(65) Prior Publication Data
US 2006/0119231 A1    Jun. 8, 2006

(30) Foreign Application Priority Data
Dec. 6, 2004    (JP)    ............... 2004-353274

(51) Int. Cl.
*H03B 5/18* (2006.01)
(52) U.S. Cl. ................... 331/107 A; 333/164
(58) Field of Classification Search ............ 331/107 A
See application file for complete search history.

(56) References Cited

U.S. PATENT DOCUMENTS

| 3,999,150 | A | 12/1976 | Caragliano et al. |
| 6,630,874 | B2 | 10/2003 | Matsumoto et al. |
| 6,727,767 | B2 * | 4/2004 | Takada ................... 331/107 A |
| 2005/0001690 | A1 | 1/2005 | Takada et al. |

FOREIGN PATENT DOCUMENTS

| JP | 51-078671 A1 | 7/1976 |
| JP | 04-047801 A1 | 2/1992 |
| JP | 04-207512 A1 | 7/1992 |
| JP | 05-243820 A1 | 9/1993 |
| JP | 05-267973 A1 | 10/1993 |
| JP | 2001-313501 A1 | 11/2001 |
| JP | 2002-057525 A1 | 2/2002 |
| JP | 2003-110360 A1 | 4/2003 |
| JP | 2004-140585 A1 | 5/2004 |
| JP | 2004-363922 A1 | 12/2004 |

OTHER PUBLICATIONS

Yoshihiro Konishi, "Basics and Applications of Microwave Circuit," Sogo Electronics Press, Aug. 20, 1990, pp. 195-198 (Partial Translation).

* cited by examiner

*Primary Examiner*—Joseph Chang
(74) *Attorney, Agent, or Firm*—Burr & Brown

(57) ABSTRACT

An oscillator includes a phase shifter and a power distributor which are disposed in a dielectric substrate comprising a plurality of stacked dielectric layers. The phase shifter comprises a coupler and a reflecting circuit. The dielectric substrate has a first formation region containing a plurality of electrodes serving as the coupler, a second formation region containing a plurality of electrodes serving as the reflecting circuit, and a third formation region containing a plurality of electrodes serving as the power distributor. The first formation region, the second formation region, and the third formation region are disposed in respective positions that are spaced from each other in a plane within the dielectric substrate.

11 Claims, 5 Drawing Sheets

DIELECTRIC SUBSTRATE FOR OSCILLATOR

BACKGROUND OF THE INVENTION

1. Field of the Invention

The present invention relates to an oscillator, such as a voltage-controlled oscillator or the like, for use in optical communication devices, the oscillator having a phase shifter and a power distributor in a dielectric substrate made up of a plurality of dielectric layers.

2. Description of the Related Art

As electronic devices are becoming smaller and thinner, there are also demands for smaller and thinner oscillators for use in optical communication devices.

Conventional oscillators comprise chip components mounted on a glass epoxy substrate. It has been difficult to reduce the size of the conventional oscillators because the mounted chip components take up a large installation area on the glass epoxy substrate.

For the purpose of reducing size, an oscillator having an organic multilayer substrate such as a glass epoxy substrate or the like includes interconnections and striplines disposed between the layers of the organic multilayer substrate, and individual chip components mounted on the surface layer of the organic multilayer substrate. Since the size of the organic multilayer substrate is determined by the layout of the mounted chip components, the line width of the interconnections and small-size chip components are used for thereby reducing the installation area of the organic multilayer substrate.

An oscillator employing a dielectric substrate made of alumina having a low dielectric constant or the like can have a reduced number of individual chip components mounted on the surface layer, further reducing the substrate area because passive components fabricated according to the thick-film forming technology and interconnections can be placed on inner layers of the dielectric substrate. For details, reference should be made to Japanese Laid-Open Patent Publication No. 2002-57525.

There are instances where the number of components is reduced by providing a distributed-constant circuit, rather than a lumped-constant circuit, in a dielectric substrate (see, for example, Japanese Laid-Open Patent Publication No. 4-207512, Japanese Laid-Open Patent Publication No. 2001-313501, and Japanese Laid-Open Patent Publication No. 2003-110360). There are also disclosed directional couplers whose size is effectively reduced by two spiral striplines disposed in confronting relation to each other with a dielectric layer sandwiched therebetween for changing a lumped-constant circuit to a distributed-constant circuit (see, for example, Japanese Laid-Open Patent Publication No. 51-78671 and Japanese Laid-Open Patent Publication No. 5-243820).

Heretofore, most size-reducing attempts are directed to changing a lumped-constant circuit to a distributed-constant circuit and specifying the configuration of the distributed-constant circuit. However, suggestions have not been made with respect to the layout of circuit components in a dielectric substrate. If the layout of circuit components is taken into consideration, then even an oscillator with a lumped-constant circuit can sufficiently be reduced in size. Furthermore, if the lumped-constant circuit is changed to a distributed-constant circuit, then the number of components can be reduced and the oscillator can be further reduced in size, thereby making the electronic device incorporating the oscillator smaller.

SUMMARY OF THE INVENTION

It is an object of the present invention to provide an oscillator which can be reduced in size by taking the layout of circuit components into account, allowing an electronic device incorporating the oscillator to be also reduced in size.

According to the present invention, an oscillator includes a phase shifter and a power distributor which are disposed in a dielectric substrate comprising a plurality of stacked dielectric layers, the phase shifter comprising a coupler and a reflecting circuit, the dielectric substrate having a first formation region containing a plurality of electrodes serving as the coupler, a second formation region containing a plurality of electrodes serving as the reflecting circuit, and a third formation region containing a plurality of electrodes serving as the power distributor, wherein the first formation region, the second formation region, and the third formation region are disposed in respective positions that are spaced from each other in a plane within the dielectric substrate.

With the above arrangement, the dielectric substrate has a principal surface, e.g., an upper surface, which remains large enough to place thereon external circuits that are connected to the circuit components, i.e., the coupler, the reflecting circuit, and the power distributor, which are disposed in the dielectric substrate. Nevertheless, the oscillator is low in profile and small in size, thereby allowing an electronic device incorporating the oscillator to be small in size.

The second formation region may be disposed substantially centrally in the plane within the dielectric substrate, the first formation region may be disposed in the plane within the dielectric substrate between the second formation region and an end face of the dielectric substrate, and the third formation region may be disposed in the plane within the dielectric substrate between the second formation region and another end face of the dielectric substrate.

In the plane within the dielectric substrate, the reflecting circuit is disposed between the coupler and the power distributor. The coupler and the power distributor, whose circuit constants are determined for desired characteristics, are spaced apart from each other, with the reflecting circuit disposed therebetween. Therefore, the first formation region, the second formation region, and the third formation region are positioned to keep the coupler and the power distributor out of electromagnetic interference with each other and also to keep them compact.

Furthermore, since the layout of the circuit components is taken into account, the oscillator with a lumped-constant circuit can sufficiently be reduced in size, allowing the electronic device incorporating the oscillator to be also reduced in size.

The electrodes serving as the coupler may include two spiral stripline electrodes disposed in the first formation region with one of the dielectric layers sandwiched between the two spiral stripline electrodes.

Specifically, as disclosed in Japanese Laid-Open Patent Publication No. 5-243820, if a lumped-constant circuit comprises straight stripline electrodes, then since the straight stripline electrodes need a length of $\lambda/4$, they are required to have a length of 7.5 cm (it is assumed that the dielectric constant=1) for signals of 1 GHz. For coupling straight stripline electrodes, a relatively large area is necessary, making it difficult to achieve both a smaller size and a desired performance capability.

However, since the coupler is constructed of the two spiral stripline electrodes with the dielectric layer sandwiched therebetween, the transmission impedance of the coupler is increased. Therefore, the performance of the oscillator is maintained though its size is reduced.

The electrodes serving as the reflecting circuit may include a plurality of inductive electrodes and capacitive electrodes disposed in the second formation region, the inductive electrodes providing an inductance of the reflecting circuit, and the capacitive electrodes and a ground electrode on the dielectric substrate providing an electrostatic capacitance of the reflecting circuit.

The electrodes serving as the power distributor may include a plurality of inductive electrodes and a plurality of capacitive electrodes disposed in the third formation region, the inductive electrodes providing an inductance of the power distributor, and the capacitive electrodes and the ground electrode on the dielectric substrate providing an electrostatic capacitance of the power distributor.

Preferably, the inductive electrodes providing the inductance of the reflecting circuit and the capacitive electrodes providing the capacitance of the reflecting circuit are spaced from each other in a direction in which the dielectric layers of the dielectric substrate are stacked, and the inductive electrodes providing the inductance of the power distributor and the capacitive electrodes providing the capacitance of the power distributor are spaced from each other in the direction in which the dielectric layers of the dielectric substrate are stacked.

If the stacked dielectric layers have different dielectric constants, then the dielectric constant of the region where the inductive electrodes are provided and the dielectric constant of the region where the capacitive electrodes are provided can easily be changed for a further reduction in the size of the oscillator.

The electrodes serving as the power distributor may include two spiral stripline electrodes disposed in the third formation region with one of the dielectric layers sandwiched between the two spiral stripline electrodes. The transmission impedance can be increased to achieve both a smaller size and a desired performance capability.

The electrodes serving as the reflecting circuit may include a plurality of inductive electrodes and capacitive electrodes disposed in the second formation region, the inductive electrodes providing an inductance of the reflecting circuit, and the capacitive electrodes and a ground electrode on the dielectric substrate providing an electrostatic capacitance of the reflecting circuit.

Preferably, the inductive electrodes providing the inductance of the reflecting circuit and the capacitive electrodes providing the capacitance of the reflecting circuit are spaced from each other in a direction in which the dielectric layers of the dielectric substrate are stacked.

According to the present invention, as described above, since the layout of the circuit components is taken into account, the oscillator can be reduced in size, allowing the electronic device incorporating the oscillator to be also reduced in size.

The above and other objects, features, and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

An oscillator according to an embodiment of the present invention, which comprises a voltage-controlled oscillator, and modifications thereof will be described below with reference to FIGS. 1 through 5.

Figure 1:
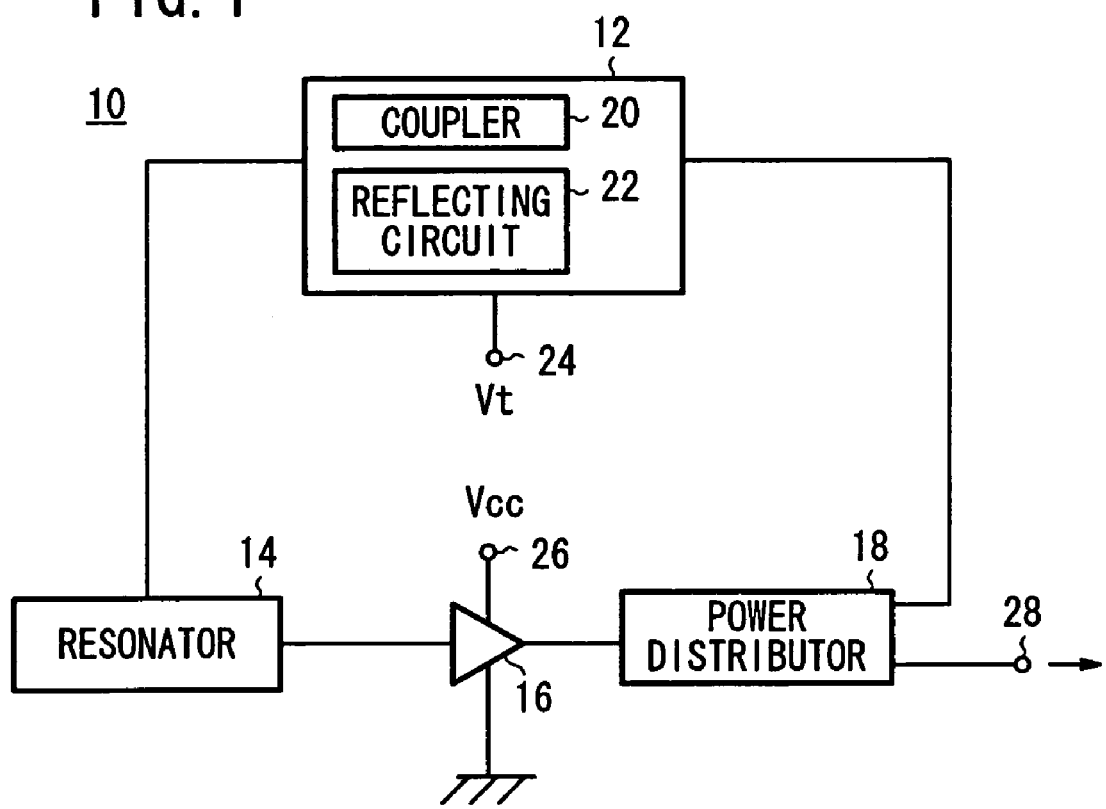
FIG. 1 is a block diagram of an oscillator according to an embodiment of the present invention.

As shown in FIG. 1, an oscillator 10 according to the embodiment of the present invention has a phase shifter 12, a resonator 14, an amplifier 16, and a power distributor 18.

The phase shifter 12 has a coupler 20 and a reflecting circuit 22. The phase shifter 12 changes the phase of a signal that passes through the phase shifter 12, i.e., to change an oscillating frequency, based on a control voltage Vt applied to a control terminal 24. The resonator 14 oscillates at a certain frequency only, and may be a surface acoustic wave resonator or a crystal resonator. The amplifier 16 is a circuit for amplifying a signal from the resonator 14, and has a power supply terminal 26 supplied with a power supply voltage Vcc. The power distributor 18 distributes a signal from the amplifier 16 to the phase shifter 12 and an output terminal 28.

Figure 2:
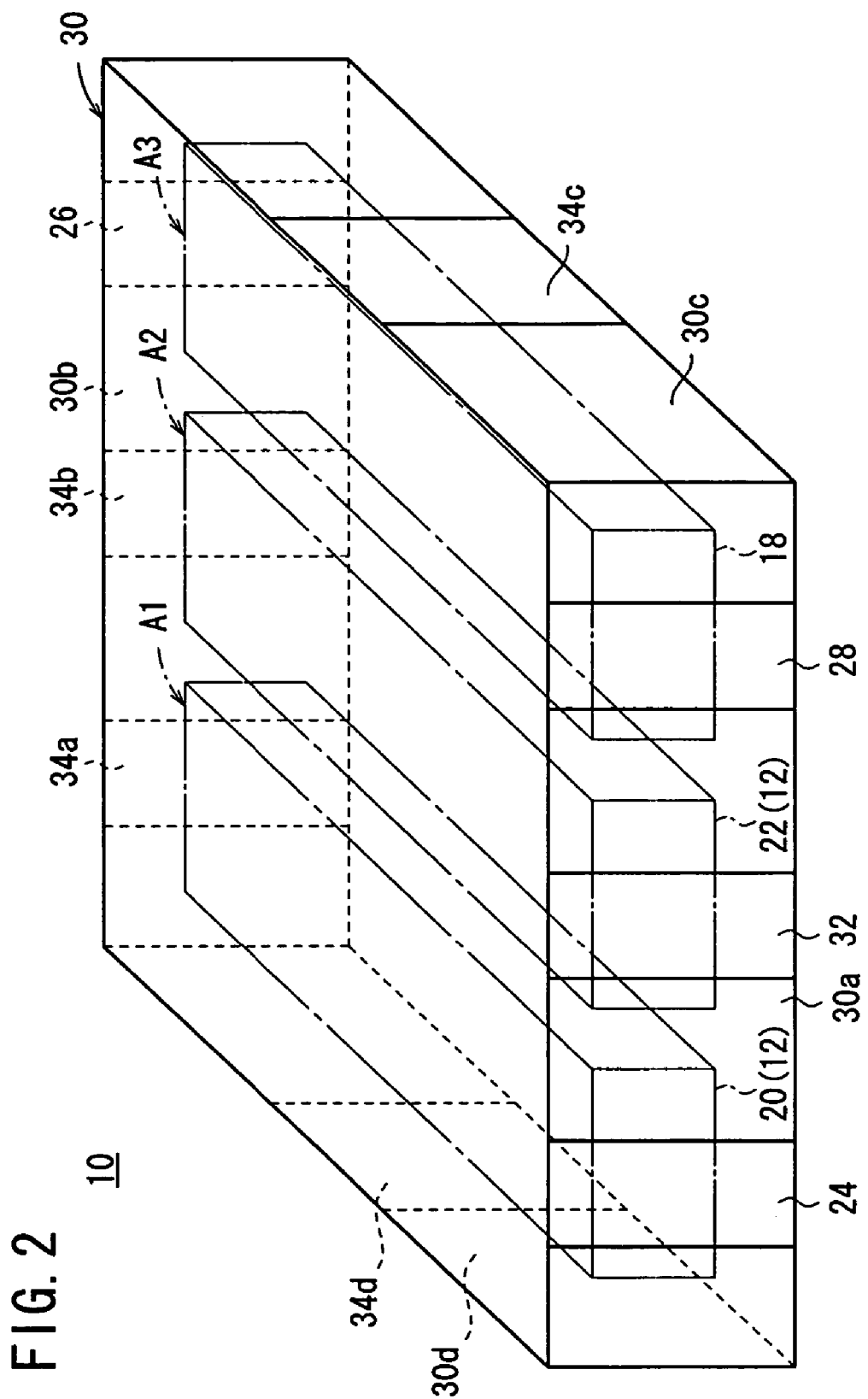
FIG. 2 is a schematic perspective view showing the layout of first through third formation regions in a dielectric substrate of the oscillator according to the embodiment of the present invention.

According to the present embodiment, as shown in FIG. 2, the coupler 20 of the phase shifter 12, the reflecting circuit 22 of the phase shifter 12, and the power distributor 18 are provided in a dielectric substrate 30 which comprises a plurality of stacked dielectric layers. Although not shown, each of the coupler 20, the reflecting circuit 22, and the power distributor 18 is in the form of a lumped-constant circuit.

Figure 3:
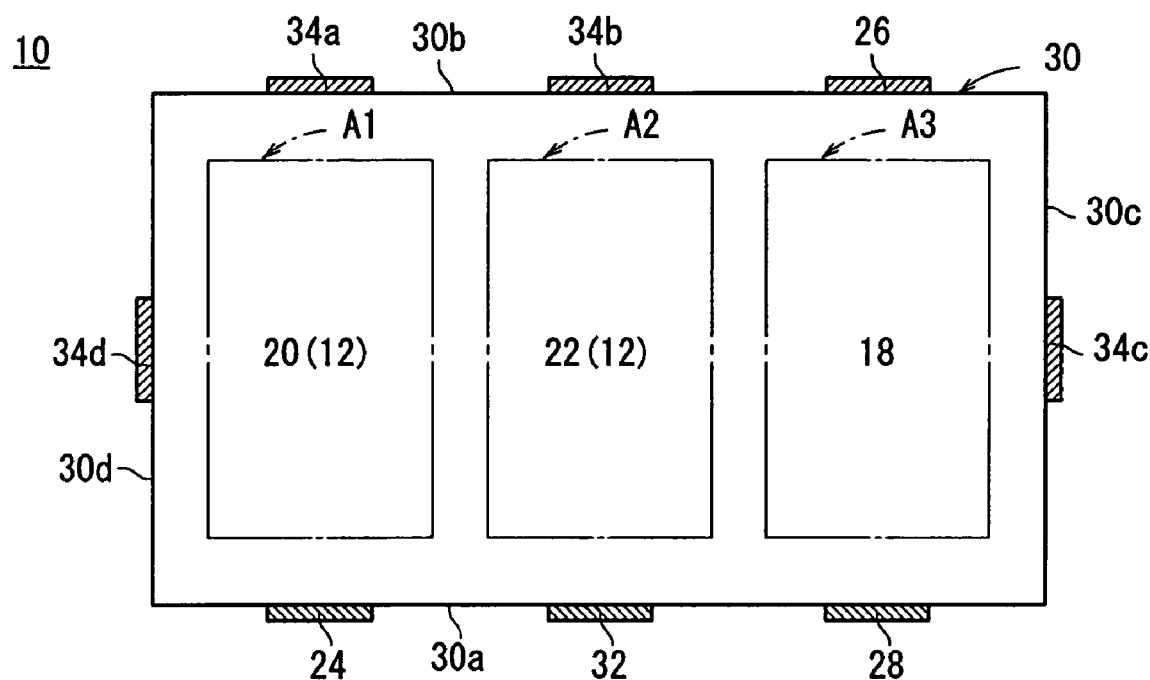
FIG. 3 is a transverse cross-sectional view showing the layout of the first through third formation regions in the dielectric substrate.

As shown in FIGS. 2 and 3, the dielectric substrate 30 has a first side surface 30a supporting thereon a control terminal 24, an NC terminal (no-connection terminal) 32, and the output terminal 28, and a second side surface 30b opposite to the first side surface 30a supporting thereon two ground terminals 34a, 34b and the power supply terminal 26. The dielectric substrate 30 has a third side surface 30c supporting thereon a ground terminal 34c, and a fourth side surface 30d opposite to the third side surface 30c supporting thereon a ground terminal 34d.

The dielectric substrate 30 has a first formation region A1 containing a plurality of electrodes serving as the coupler 20, a second formation region A2 containing a plurality of electrodes serving as the reflecting circuit 22, and a third formation region A3 containing a plurality of electrodes serving as the power distributor 18.

As shown in FIGS. 2 and 3, the first formation region A1, the second formation region A2, and the third formation region A3 are disposed in respective positions that are spaced from each other in a plane within the dielectric substrate 30.

Specifically, the second formation region A2 is disposed substantially centrally in the plane within the dielectric substrate 30. The first formation region A1 is disposed in the plane within the dielectric substrate 30 between the second formation region A2 and one end face (the fourth side surface 30d) of the dielectric substrate 30. The third formation region A3 is disposed in the plane within the dielectric substrate 30 between the second formation region A2 and the other end face (the third side surface 30c) of the dielectric substrate 30.

The dielectric substrate 30 has a principal surface, e.g., an upper surface, which remains large enough to place thereon external circuits (part of the phase shifter 12, the resonator 14, and the amplifier 16) that are connected to the circuit components (the coupler 20, the reflecting circuit 22, and the power distributor 18), which are disposed in the dielectric substrate 30. Nevertheless, the oscillator 10 is low in profile and small in size, allowing an electronic device incorporating the oscillator 10 to be small in size.

According to the planar layout in the dielectric substrate 30, the reflecting circuit 22 is positioned between the coupler 20 and the power distributor 18. The coupler 20 and the power distributor 18, whose circuit constants are determined for desired characteristics, are spaced apart from each other, with the reflecting circuit 22 disposed therebetween. Therefore, the first formation region A1, the second formation region A2, and the third formation region A3 are positioned to keep the coupler 20 and the power distributor 18 out of electromagnetic interference with each other and also to keep them compact.

In order to suppress an electromagnetic coupling between the circuit components (the coupler 20, the reflecting circuit 22, and the power distributor 18), the inductive component of the coupler 20 and the inductive component of the power distributor 18 should be spaced from each other because the electrodes providing those inductive components are large in size. Particularly, it is preferable to dispose the inductive component of the reflecting circuit 22 at equal distances from the inductive component of the coupler 20 and the inductive component of the power distributor 18. Ground vias (not shown), i.e., vias connected to a ground electrode disposed on the dielectric substrate 30, are provided between the inductive component of the coupler 20 and the inductive component of the reflecting circuit 22 and between the inductive component of the power distributor 18 and the inductive component of the reflecting circuit 22 to shorten the distance between the inductive component of the coupler 20 and the inductive component of the reflecting circuit 22 and the distance between the inductive component of the power distributor 18 and the inductive component of the reflecting circuit 22, thereby further reducing the size of the oscillator 10.

According to the present embodiment, as described above, since the layout of the circuit components is taken into account, the oscillator 10 with the lumped-constant circuit can sufficiently be reduced in size, allowing the electronic device incorporating the oscillator 10 to be also reduced in size.

An oscillator 10a according to a first modification of the present invention will be described below with reference to FIG. 4. The oscillator 10a according to the first modification differs from the above oscillator 10 in that the coupler 20 of the phase shifter 12 comprises two spiral stripline electrodes disposed in confronting relation to each other with a dielectric layer sandwiched therebetween.

Figure 4:
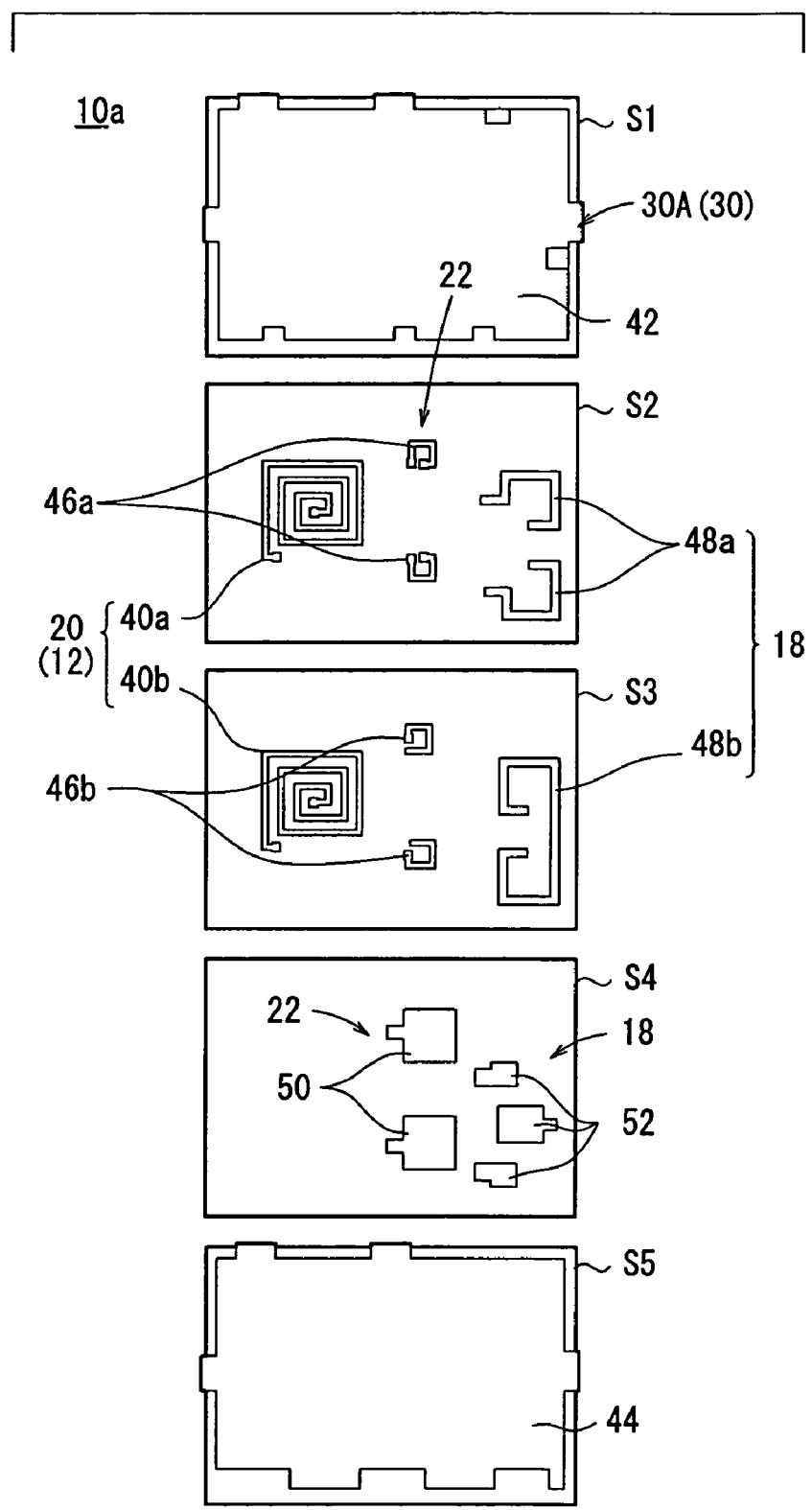
FIG. 4 is a plan view of electrodes disposed on first through fifth dielectric layers in a main circuit formation region of a dielectric substrate of an oscillator according to a first modification of the present invention.

Specifically, as shown in FIG. 4, the oscillator 10a has a dielectric substrate 30 which comprises a plurality of dielectric layers stacked and sintered into an integral structure.

The dielectric substrate 30 has a main circuit formation section 30A containing the coupler 20, the reflecting circuit 22, and the power distributor 18, and a connection formation section (not shown) placed on an upper surface of the main circuit formation section 30A and having a connector for connecting the coupler 20, the reflecting circuit 22, and the power distributor 18 to an external circuit. Details of the main circuit formation section 30A will chiefly be described below.

As shown in FIG. 4, the main circuit formation section 30A comprises a first dielectric layer S1, a second dielectric layer S2, a third dielectric layer S3, a fourth dielectric layer S4, and a fifth dielectric layer S5 which are stacked successively. Each of the first through fifth dielectric layers S1 through S5 comprises a single layer or a plurality of layers.

The coupler 20, the reflecting circuit 22, and the power distributor 18 are disposed in the main circuit formation section 30A. The coupler 20 and the power distributor 18 are spaced from each other, and the reflecting circuit 22 is disposed between the coupler 20 and the power distributor 18.

Inner-layer ground electrodes 42, 44 are disposed respectively on principal surfaces of the first dielectric layer S1 and the fifth dielectric layer S5. The inner-layer ground electrodes 42, 44 are connected to the ground terminals 34a through 34d on the side surfaces of the dielectric substrate 30, as shown in FIG. 3.

As shown in FIG. 4, the second dielectric layer S2 supports on its principal surface a first spiral stripline electrode 40a serving as the coupler 20, first inductive electrodes 46a serving as the reflecting circuit 22, and first inductive electrodes 48a serving as the power distributor 18. The third dielectric layer S3 supports on its principal surface a second spiral stripline electrode 40b serving as the coupler 20, second inductive electrodes 46b serving as the reflecting circuit 22, and second inductive electrodes 48b serving as the power distributor 18. The first spiral stripline electrode 40a and the second spiral stripline electrode 40b are disposed in respective positions confronting each other with the second dielectric layer S2 sandwiched therebetween.

The fourth dielectric layer S4 supports on its principal surface capacitive electrodes 50 serving as the reflecting circuit 22 and capacitive electrodes 52 serving as the power distributor 18.

The first and second inductive electrodes 46a, 46b on the second and third dielectric layers S2, S3 provide an inductive component of the reflecting circuit 22, and the capacitive electrodes 50 on the fourth dielectric layer S4 and the inner-layer ground electrode 44 provide a capacitive component (electrostatic capacitance) of the reflecting circuit 22.

The first and second spiral stripline electrodes 40a, 40b on the second and third dielectric layers S2, S3 provide the coupler 20.

The first and second inductive electrodes 48a, 48b on the second and third dielectric layers S2, S3 provide an inductive component of the power distributor 18, and the capacitive electrodes 52 on the fourth dielectric layer S4 and the inner-layer ground electrode 44 provide a capacitive component (electrostatic capacitance) of the power distributor 18.

In the oscillator 10a according to the first modification, as described above, the coupler 20 and the power distributor 18 are disposed in respective positions spaced from each other with the reflecting circuit 22 disposed therebetween, as with the oscillator 10 according to the above embodiment. Therefore, the coupler 20 and the power distributor 18 are kept out of electromagnetic interference with each other and are also kept in a compact layout.

According to the first modification, furthermore, since the coupler 20 is constructed of the first and second spiral stripline electrodes 40a, 40b with the second dielectric layer S2 sandwiched therebetween, the transmission impedance of the coupler 20 is increased. Therefore, the performance of the oscillator 10a is maintained though its size is reduced.

Consequently, the number of components of the oscillator 10a is significantly reduced than if the coupler 20 comprises a lumped-constant circuit, and the oscillator 10a is less costly to manufacture. Moreover, the size of the oscillator 10a is much smaller than if the coupler 20 comprises a distributed-constant circuit of straight stripline electrodes.

In the oscillator 10a according to the first modification, the second and third dielectric layers S2, S3 support thereon the first and second spiral stripline electrodes 40a, 40b which serve as the coupler 20, the first and second inductive electrodes 46a, 46b which serve as the reflecting circuit 22, and the first and second inductive electrodes 48a, 48b which serve as the power distributor 18, and the fourth dielectric layer S4 supports thereon the capacitive electrodes 50 serving as the reflecting circuit 22 and the capacitive electrodes 52 serving as the power distributor 18.

Stated otherwise, the region where the inductive electrodes are provided and the region where the capacitive electrodes are provided are spaced from each other in the direction in which the dielectric layers of the dielectric substrate 30 are stacked.

If the stacked dielectric layers have different dielectric constants, then the dielectric constant of the region where the inductive electrodes are provided and the dielectric constant of the region where the capacitive electrodes are provided can easily be changed for a further reduction in the size of the oscillator 10a.

In the above oscillator 10a according to the first modification, the first spiral stripline electrode 40a serving as the coupler 20, the first inductive electrodes 46a serving as the reflecting circuit 22, and the first inductive electrodes 48a serving as the power distributor 18 are provided on the second dielectric layer S2. However, the first spiral stripline electrode 40a, the first inductive electrodes 46a, and the first inductive electrodes 48a may be provided on respective different dielectric layers. The second spiral stripline electrode 40b, the second inductive electrodes 46b, and the second inductive electrodes 48b provided on the third dielectric layer S3 may also be provided on respective different dielectric layers, and the capacitive electrodes 50 serving as the reflecting circuit 22 and the capacitive electrodes 52 serving as the power distributor 18 provided on the fourth dielectric layer S4 may also be provided on respective different dielectric layers.

An oscillator 10b according to a second modification of the present invention will be described below with reference to FIG. 5. Those parts of the oscillator 10b which are identical to those of the oscillator 10a are denoted by identical reference characters, and will not be described in detail below.

The oscillator 10b according to the second modification is of basically the same structure as the oscillator 10a according to the first modification, but differs therefrom in that the power distributor 18 comprises a first spiral stripline electrode 54a disposed on the principal surface of the second dielectric layer S2 and a second spiral stripline electrode 54b disposed on the principal surface of the third dielectric layer S3, with the second dielectric layer S2 sandwiched therebetween.

Figure 5:
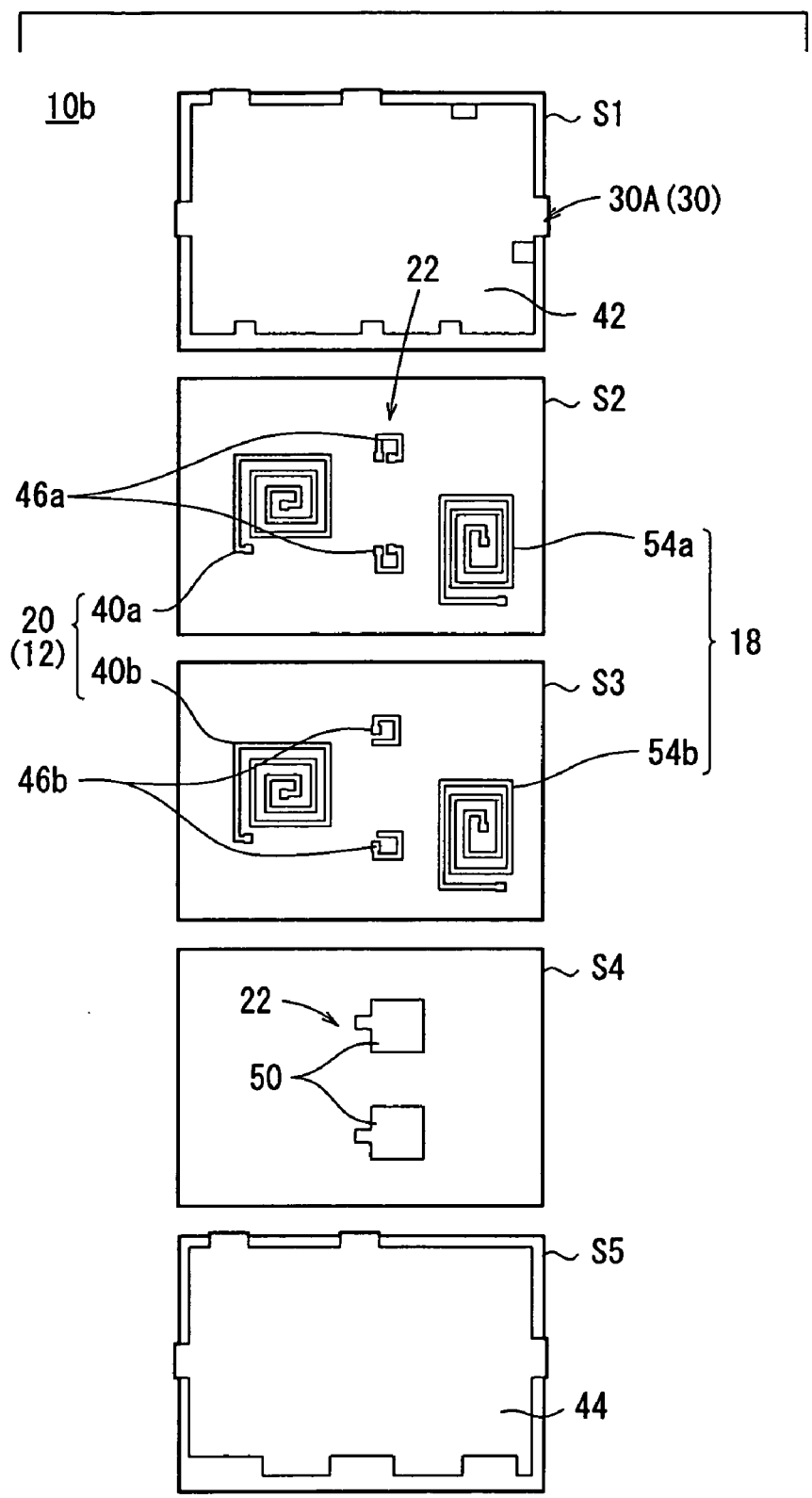
FIG. 5 is a plan view of electrodes disposed on first through fifth dielectric layers in a main circuit formation region of a dielectric substrate of an oscillator according to a second modification of the present invention.

The capacitive electrodes 52 serving as the power distributor 18 on the fourth dielectric layer S4 shown in FIG. 4 according to the first modification are omitted from illustration in FIG. 5.

In the oscillator 10b according to the second modification, the transmission impedances of the coupler 20 and the power distributor 18 are increased. Therefore, the performance of the oscillator 10b is maintained though its size is reduced.

Consequently, the number of components of the oscillator 10b is significantly reduced than if each of the coupler 20 and the power distributor 18 comprises a lumped-constant circuit, and the oscillator 10a is much less costly to manufacture and much smaller in size.

In the oscillator 10b according to the second modification, the first spiral stripline electrode 40a serving as the coupler 20, the first inductive electrodes 46a serving as the reflecting circuit 22, and the first spiral stripline electrode 54a serving as the power distributor 18 are provided on the second dielectric layer S2. However, the first spiral stripline electrode 40a, the first inductive electrodes 46a, and the first spiral stripline electrode 54a may be provided on respective different dielectric layers. The second spiral stripline electrode 40b, the second inductive electrodes 46b, and the second spiral stripline electrode 54b provided on the second dielectric layer S2 may also be provided on respective different dielectric layers.

Although certain preferred embodiments of the present invention have been shown and described in detail, it should be understood that various changes and modifications may be made therein without departing from the scope of the appended claims.

What is claimed is:

1. An oscillator comprising:
   a dielectric substrate comprising a plurality of stacked dielectric layers;
   a phase shifter disposed in said dielectric substrate, said phase shifter comprising a coupler and a reflecting circuit; and
   a power distributor disposed in said dielectric substrate;
   said dielectric substrate having a first formation region containing a plurality of electrodes serving as said coupler, a second formation region containing a plurality of electrodes serving as said reflecting circuit, and a third formation region containing a plurality of electrodes serving as said power distributor;
   wherein said first formation region, said second formation region, and said third formation region are disposed in respective positions that are spaced from each other in a plane within said dielectric substrate, and
   wherein each of said plurality of dielectric layers comprises a part of said first formation region, a part of said second formation region and a part of said third formation region.

2. An oscillator according to claim 1, wherein said first formation region, said second formation region and said third formation region are formed only by said plurality of dielectric layers.

3. An oscillater comprising:
   a dielectric substrate comprising a plurality of stacked dielectric layers;
   a phase shifter disposed in said dielectric substrate, said phase shifter comprising a coupler and a reflecting circuit; and a power distributor disposed in said dielectric substrate;

said dielectric substrate having a first formation region containing a plurality of electrodes serving as said coupler, a second formation region containing a plurality of electrodes as said reflecting circuit, and a third formation region containing a plurality of electrodes serving as said power distributor;

wherein said first formation region, said second formation region, and said third formation region are disposed in respective positions that are spaced from each other in a plane within said dielectric substrate; and wherein said second formation region is disposed substantially centrally in the plane within said dielectric substrate, said first formation region is disposed in the plane within said dielectric substrate between said second formation region and an end face of said dielectric substrate, and said third formation region is disposed in the plane within said dielectric substrate between said second formation region and another end face of said dielectric substrate.

4. An oscillator according to claim 3, wherein said electrodes serving as said coupler include two spiral stripline electrodes disposed in said first formation region with one of said dielectric layers sandwiched between said two spiral stripline electrodes.

5. An oscillator according to claim 3, wherein said electrodes serving as said reflecting circuit include a plurality of inductive electrodes and capacitive electrodes disposed in said second formation region, said inductive electrodes providing an inductance of said reflecting circuit, and capacitive electrodes and a ground electrode on said dielectric substrate providing an electrostatic capacitance of said reflecting circuit, and wherein said electrodes serving as said power distributor include a plurality of inductive electrodes and a plurality of capacitive electrodes disposed in said third formation region, said inductive electrodes providing an inductance of said power distributor, and said capacitive electrodes and said ground electrode on said dielectric substrate providing an electrostatic capacitance of said power distributor.

6. An oscillator according to claim 5, wherein said inductive electrodes providing the inductance of said reflecting circuit and said capacitive electrodes providing the capacitance of said reflecting circuit are spaced from each other in a direction in which said dielectric layers of said dielectric substrate are stacked, and wherein said inductive electrodes providing the inductance of said power distributor and said capacitive electrodes providing the capacitance of said power distributor are spaced from each other in the direction in which said dielectric layers of said dielectric substrate are stacked.

7. An oscillator according to claim 3, wherein said electrodes serving as said power distributor include two spiral stripline electrodes disposed in said third formation region with one of said dielectric layers sandwiched between said two spiral stripline electrodes.

8. An oscillator according to claim 7, wherein said electrodes serving as said reflecting circuit include a plurality of inductive electrodes and capacitive electrodes disposed in said second formation region, said inductive electrodes providing an inductance of said reflecting circuit, and capacitive electrodes and a ground electrode on said dielectric substrate providing an electrostatic capacitance of said reflecting circuit.

9. An oscillator according to claim 8, wherein said inductive electrodes providing the inductance of said reflecting circuit and said capacitive electrodes providing the capacitance of said reflecting circuit are spaced from each other in a direction in which said dielectric layers of said dielectric substrate are stacked.

10. An oscillator according to claim 6, wherein the dielectric layer on which said inductive electrodes are formed has a dielectric constant that differs from that of the dielectric layer on which said capacitive electrodes are formed to further reduce the size of said oscillator.

11. An oscillator according to claim 9, wherein the dielectric layer on which said inductive electrodes are formed has a dielectric constant that differs from that of the dielectric layer on which said capacitive electrodes are formed to further reduce the size of said oscillator.

* * * * *